(12) United States Patent
Kim et al.

(10) Patent No.: US 9,975,151 B2
(45) Date of Patent: May 22, 2018

(54) APPARATUS AND METHOD FOR TREATING SUBSTRATE

(71) Applicant: Semes Co., Ltd., Cheonan-si, Chungcheongnam-do (KR)

(72) Inventors: Tae Keun Kim, Cheonan-si (KR); Oh Jin Kwon, Cheonan-si (KR); Ki Hoon Choi, Cheonan-si (KR)

(73) Assignee: SEMES Co., Ltd., Chungcheongnam-do (KR)

( * ) Notice: Subject to any disclaimer, the term of this patent is extended or adjusted under 35 U.S.C. 154(b) by 161 days.

(21) Appl. No.: 14/749,010

(22) Filed: Jun. 24, 2015

(65) Prior Publication Data

US 2016/0013080 A1    Jan. 14, 2016

(30) Foreign Application Priority Data

Jul. 8, 2014   (KR) ........................ 10-2014-0085460

(51) Int. Cl.
  *B08B 3/12*  (2006.01)
  *B08B 3/10*  (2006.01)
  *B08B 7/02*  (2006.01)
  *H01L 21/67* (2006.01)

(52) U.S. Cl.
  CPC ............... *B08B 3/10* (2013.01); *B08B 3/12* (2013.01); *B08B 7/028* (2013.01); *H01L 21/67017* (2013.01); *H01L 21/67051* (2013.01)

(58) Field of Classification Search
  CPC .... B08B 3/10; B08B 3/02; B08B 7/04; B08B 7/028; H01L 21/67017; H01L 21/67051; A01F 15/04; A01F 15/0412; A01F 15/0429
  See application file for complete search history.

(56) References Cited

U.S. PATENT DOCUMENTS 8,293,662 B2 * 10/2012 Nagaseki ........... H01L 21/02126
                                                      118/300
2009/0293920 A1 * 12/2009 Watanabe ............. B01F 3/0446
                                                      134/102.1

FOREIGN PATENT DOCUMENTS

| CN | 101599424 A  |   | 12/2009 |
| JP | 2008253893   | * | 10/2008 |
| JP | 2008253893 A |   | 10/2008 |
| JP | 2009/246000 A |  | 10/2009 |
| JP | 2009246000   | * | 10/2009 |

(Continued)

*Primary Examiner* — Saeed T Chaudhry
(74) *Attorney, Agent, or Firm* — Harness, Dickey & Pierce, P.L.C.

(57) ABSTRACT

Embodiments of the inventive concepts provide an apparatus and a method for treating a substrate. The apparatus includes a substrate support unit supporting the substrate, and a liquid supply unit supplying a treatment solution to the substrate supported by the substrate support unit. The liquid supply unit includes a nozzle discharging the treatment solution to the substrate, a liquid supply line supplying the treatment solution to the nozzle, a mixing member installed on the liquid supply line, a mixing space formed within the mixing member, and a gas supply line connected to the mixing member to supply a gas into the mixing space. The mixing member includes a body within which the mixing space is formed, and an inflow port combined with the body such that the gas supplied through the inflow port is mixed with the treatment solution in the mixing space to form nano-sized bubbles.

12 Claims, 6 Drawing Sheets

(56) References Cited

FOREIGN PATENT DOCUMENTS

| | | | |
|---|---|---|---|
| JP | 2013103205 | A | 5/2013 |
| KR | 20070095776 | A | 10/2007 |
| KR | 20090027033 | A | 3/2009 |
| KR | 20100052658 | A | 5/2010 |
| KR | 20120098412 | A | 9/2012 |
| KR | 20120108673 | A | 10/2012 |
| KR | 1020120108673 | * | 10/2012 |
| KR | 101330990 | B1 | 11/2013 |

* cited by examiner

APPARATUS AND METHOD FOR TREATING SUBSTRATE

CROSS-REFERENCE TO RELATED APPLICATION

This U.S. non-provisional patent application claims priority under 35 U.S.C. § 119 to Korean Patent Application No. 10-2014-0085460, filed on Jul. 8, 2014, in the Korean Intellectual Property Office, the disclosure of which is hereby incorporated by reference in its entirety.

BACKGROUND

The inventive concepts relate to an apparatus and a method for treating a substrate using liquid.

Various processes (e.g., photolithography, etching, ashing, ion implantation and deposition processes) are performed to manufacture a semiconductor device or a liquid crystal display device. A cleaning process is performed before or after each of the processes for removing contaminants and/or particles generated in each of the processes.

The cleaning process is a process that supplies a treatment solution to a substrate to remove contaminants and/or particles adhered to the substrate. An apparatus for performing a cleaning process may include a treatment solution nozzle and an ultrasonic nozzle. FIG. 1 is a cross-sectional view illustrating a treatment solution nozzle and an ultrasonic nozzle of a general apparatus performing a cleaning process. Referring to FIG. 1, a treatment solution nozzle 2 may supply a treatment solution onto a substrate, and an ultrasonic nozzle 4 may provide ultrasonic waves to the treatment solution supplied on the substrate. Bubbles may be formed in the treatment solution provided with the ultrasonic waves. The bubbles may repeatedly contract and expand by the ultrasonic waves so as to be broken, and the particles adhered to the substrate may be removed by a shock wave generated during the breakage of the bubbles.

However, diameters of the bubbles formed by the ultrasonic waves may be in the range of several micrometers to several tens micrometers. On the contrary, a plurality of patterns may be formed on the substrate, and distances between the patterns may be in the range of several nanometers to several tens nanometers. Thus, the bubbles formed by the ultrasonic waves may be difficult to be provided into spaces between the patterns. In other words, it may be difficult to remove particles in the spaces between the patterns.

The bubbles may be unstably provided and may be broken before they are provided into the spaces between the patterns.

SUMMARY

Embodiments of the inventive concepts may provide an apparatus and a method capable of improving cleaning force for cleaning particles adhered to a substrate.

Embodiments of the inventive concepts may also provide an apparatus and a method capable of removing particles adhered in nano-sized spaces between patterns.

In one aspect, an apparatus for treating a substrate may include a substrate support unit supporting the substrate, and a liquid supply unit supplying a treatment solution to the substrate supported by the substrate support unit. The liquid supply unit may include a nozzle discharging the treatment solution to a top surface of the substrate, a liquid supply line supplying the treatment solution to the nozzle, a mixing member installed on the liquid supply line and including a mixing space formed therein, and a gas supply line connected to the mixing member to supply a gas into the mixing space. The mixing member may include a body within which the mixing space is formed, and an inflow port combined with the body such that the gas supplied through the inflow port is mixed with the treatment solution in the mixing space to form nano-sized bubbles.

In an embodiment, the apparatus may further include a liquid flow rate adjuster installed on the liquid supply line to control a first flow rate of the treatment solution, a gas flow rate adjuster installed on the gas supply line to control a second flow rate of the gas, and a controller controlling at least one of the liquid flow rate adjuster and the gas flow rate adjuster such that the second flow rate is greater than the first flow rate. In an embodiment, the apparatus may further include an exhaust line diverging from an area of the liquid supply line which is disposed downstream from the mixing member in a supplying direction of the treatment solution, and a flow rate measuring unit measuring the first flow rate and the second flow rate. In an embodiment, the apparatus may further include a supply valve installed on the liquid supply line and disposed downstream from a spot, from which the exhaust line diverges, in the supplying direction of the treatment solution, and an exhaust valve installed on the exhaust line. The controller may control the supply valve and the exhaust valve in response to data received from the flow rate measuring unit. In an embodiment, the controller may open the supply valve to open the liquid supply line if the received data are in a normal state, and the controller may open the exhaust valve to open the exhaust line if the received data are in a bad state. The normal state may mean that diameters of the bubbles are equal to or smaller than 1 micrometer, and the bad state may mean that the diameters of the bubbles are greater than 1 micrometer. In an embodiment, the first flow rate may correspond to a first pressure, and the second flow rate may correspond to a second pressure. The controller may control at least one of the liquid flow rate adjuster and the gas flow rate adjuster such that a difference between the first pressure and the second pressure is 100 kpa or less.

In another aspect, a method for treating a substrate may include supplying a gas to a treatment solution to mix the treatment solution with the gas, and supplying the treatment solution mixed with the gas to the substrate to treat the substrate. The gas may be mixed with the treatment solution to form nano-sized bubbles in the treatment solution.

In an embodiment, supplying the gas to the treatment solution may include adjusting at least one of a first flow rate of the treatment solution and a second flow rate of the gas such that the second flow rate is greater than the first flow rate. The treatment solution may be supplied to the substrate or may be collected according to diameters of the bubbles. The treatment solution may be supplied to the substrate if diameters of the bubbles are equal to or smaller than a predetermined size. The treatment solution may be collected if the diameters of the bubbles are greater than the predetermined size. In an embodiment, the predetermined size may be 1 micrometer. In an embodiment, the first flow rate may correspond to a first pressure, and the second flow rate may correspond to a second pressure. In an embodiment, adjusting at least one of the first flow rate and the second flow rate may include adjusting at least one of the first pressure and the second pressure such that a difference between the first pressure and the second pressure is 100 kpa or less.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
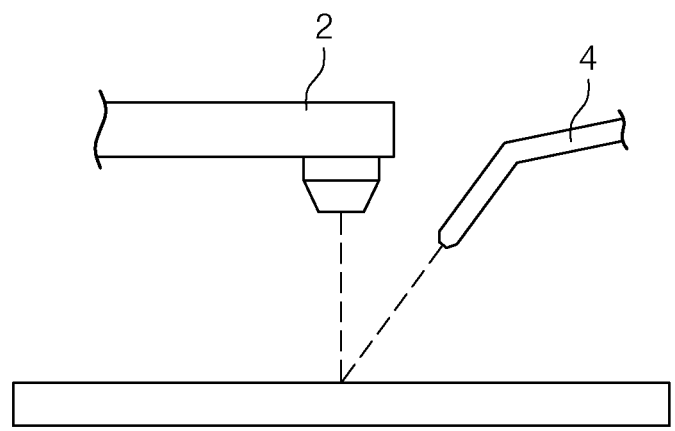
FIG. 1 is a cross-sectional view illustrating a treatment solution nozzle and an ultrasonic nozzle of a general apparatus performing a cleaning process.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

A process of cleaning a thin layer, formed on a substrate, with a cleaning solution will be described as an example in the present embodiment. For example, the thin layer may be formed of a material including germanium (Ge). However, embodiments of the inventive concepts are not limited to the cleaning process. In other embodiments, embodiments of the inventive concepts can be applied to various kinds of liquids used in a development process and an etching process.

Hereinafter, embodiments of the inventive concepts will be described in detail with reference to FIGS. 2 to 7.

Figure 2:
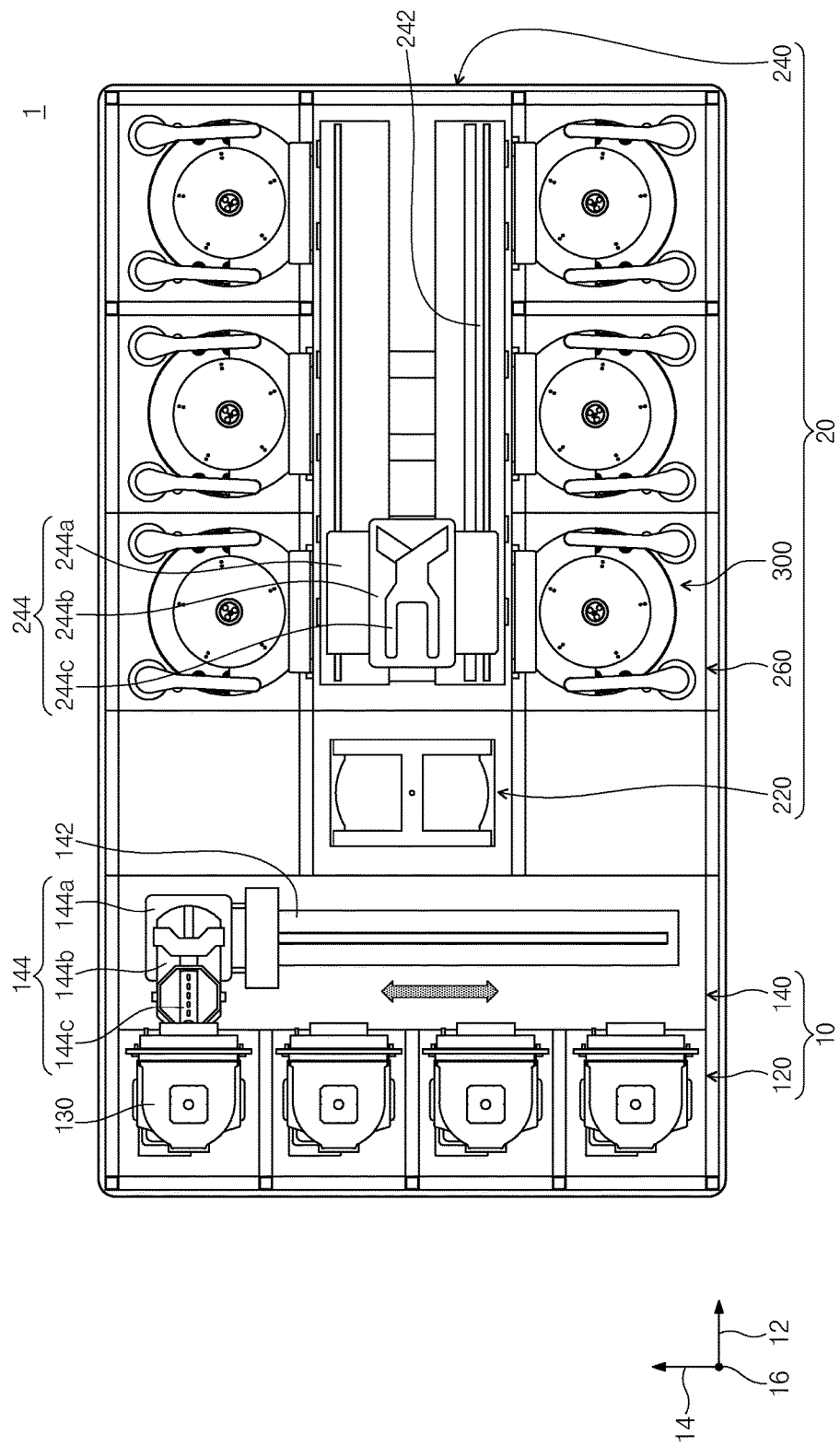
FIG. 2 is a plan view illustrating substrate-treating equipment according to example embodiments of the inventive concepts.

FIG. 2 is a plan view illustrating substrate-treating equipment according to example embodiments of the inventive concepts. Referring to FIG. 2, substrate-treating equipment 1 may include an index module 10 and a process treating module 20. The index module 10 may include a load port 120 and a transfer frame 140. The load port 120, the transfer frame 140, and the process treating module 20 may be sequentially arranged in a line. Hereinafter, a direction in which the load port 120, the transfer frame 140, and the process treating module 200 are arranged may be defined as a first direction 12, a direction perpendicular to the first direction 12 in a plan view may be defined as a second direction 14, and a direction perpendicular to a plane defined by the first and second directions 12 and 14 may be defined as a third direction 16.

A carrier 130 receiving a substrate W may be put safely on the load port 120. The load port 120 may be provided in plurality, and the plurality of load ports 120 may be arranged in a line along the second direction 14. The number of the load ports 120 may increase or decrease according to process efficiency and a footprint condition of the process treating module 20. A plurality of slots (not shown) for receiving the substrates W may be formed in the carrier 130 in such a way that the substrates W received in the slots are disposed horizontally to the ground. A front opening unified pod (FOUP) may be used as the carrier 130.

The process treating module 20 may include a buffer unit 220, a transfer chamber 240, and process chambers 260. The transfer chamber 240 may be disposed such that its longitudinal direction is parallel to the first direction 12. The process chambers 260 may be disposed at both sides of the transfer chamber 240. The process chambers 260 respectively disposed at one side and the other side of the transfer chamber 240 may be symmetrical with respect to the transfer chamber 240. A plurality of process chambers 260 may be provided at one side of the transfer chamber 240. Some of the process chambers 260 may be arranged along the longitudinal direction of the transfer chamber 240. Some of the process chambers 260 may be sequentially stacked. In other words, the process chambers 260 may be arranged in an A-by-B matrix at one side of the transfer chamber 240. Here, "A" denotes the number of process chambers 260 arranged in a line along the first direction 12, and "B" denotes the number of process chambers 260 stacked in a line along the third direction 16. If four or six process chambers 260 are provided at one side of the transfer chamber 240, the process chambers 260 may be arranged in a 2-by-2 or 3-by-2 matrix. The number of process chambers 260 may increase or decrease. In other embodiments, the process chambers 260 may be provided only at one side of the transfer chamber 240. In still other embodiments, the process chambers 260 may be arranged in a single layer at one side or both sides of the transfer chamber 240.

The buffer unit 220 may be disposed between the transfer frame 140 and the transfer chamber 240. The buffer unit 220 may provide a space in which a substrate W stays before transferred between the transfer chamber 240 and the transfer frame 140. A slot (not shown) on which a substrate W is put may be provided in the buffer unit 220. The slot may be provided in plurality in the buffer unit 220, and the slots of the buffer unit 220 may be spaced apart from each other along the third direction 16. The buffer unit 220 may have an opened side facing the transfer frame 140 and an opened side facing the transfer chamber 240.

The transfer frame 140 may transfer the substrate W between the buffer unit 220 and the carrier 130 put safely on the load port 120. An index rail 142 and an index robot 144 may be provided in the transfer frame 140. The index rail 142 may be provided such that its longitudinal direction is parallel to the second direction 14. The index robot 144 may be installed on the index rail 142 and may be linearly movable in the second direction 14 along the index rail 142. The index robot 144 may include a base 144a, a body 144b, and an index arm 144c. The base 144a may be installed to be movable along the index rail 142. The body 144b may be joined to the base 144a. The body 144b may be provided to be movable on the base 144a along the third direction 16. In addition, the body 144b may be provided to be rotatable on the base 144a. The index arm 144c may be joined to the body 144b such that it is forward and backward movable with respect to the body 144b. The index arm 144c may be provided in plurality, and the plurality of index arms 144c may be driven independently of each other. The index arms 144c may be sequentially stacked and be spaced apart from each other in the third direction 16. At least one of the index arms 144c may be used to transfer a substrate W from the process treating module 20 to the carrier 130, and at least another of the index arms 144c may be used to transfer the substrate W from the carrier 130 to the process treating module 20. Thus, it is possible to prevent particles, generated from the substrate W not experiencing a treating process when the substrate W is carried into or taken out of by the index robot 114, from being adhered to the substrate W.

The transfer chamber 240 may transfer the substrate W between the buffer unit 220 and the process chamber 260 and between the process chambers 260. A guide rail 242 and a main robot 244 may be provided in the transfer chamber 240. The guide rail 242 may be disposed such that its longitudinal direction is parallel to the first direction 12. The main robot 244 may be installed on the guide rail 242 and may be linearly moveable along the first direction 12 on the guide rail 242. The main robot 244 may include a base 244a, a body 244b, and a main arm 244c. The base 244a may be installed to be movable along the guide rail 242. The body 244b may be joined to the base 244a. The body 244b may be provided to be movable on the base 244a along the third direction 16. In addition, the body 244b may be provided to be rotatable on the base 244a. The main arm 244c may be joined to the body 244b such that it is forward and backward movable with respect to the body 244b. The main arm 244c may be provided in plurality, and the plurality of main arms 244c may be driven independently of each other. The main arms 244c may be sequentially stacked and be spaced apart from each other in the third direction 16.

A substrate treating apparatus 300 for performing a cleaning process on a substrate W may be provided in each of the process chambers 260. The substrate treating apparatuses 300 may have different structures according to kinds of the cleaning processes. Alternatively, the substrate treating apparatuses 300 of the process chambers 260 may have the same structure. Optionally, the process chambers 260 may be divided into a plurality of groups. In this case, the substrate treating apparatuses 300 in the same group may have the same structure, and the substrate treating apparatuses 300 respectively included in different groups may have different structures from each other.

Figure 3:
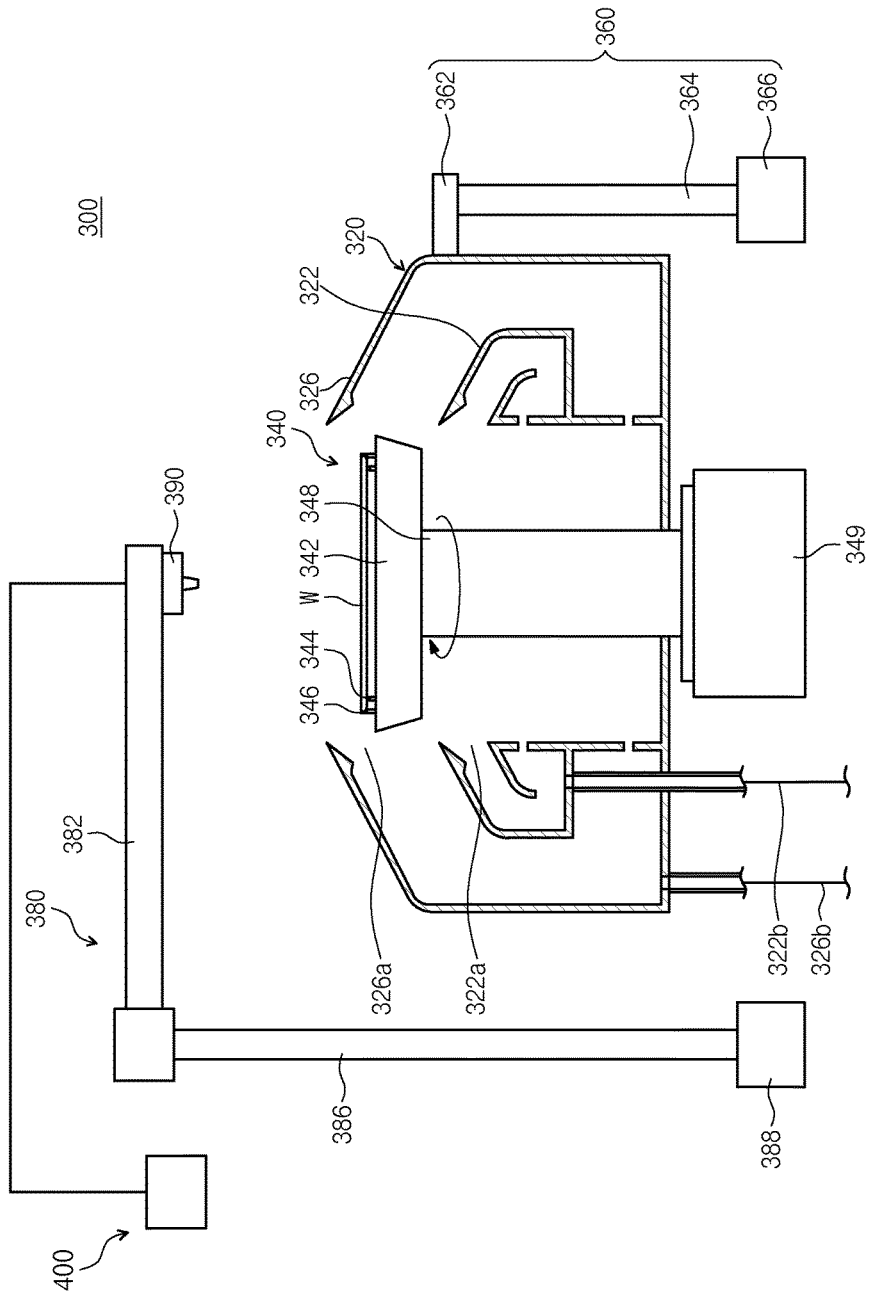
FIG. 3 is a cross-sectional view illustrating a substrate treating apparatus of FIG. 2.

FIG. 3 is a cross-sectional view illustrating a substrate treating apparatus of FIG. 2. Referring to FIG. 3, the substrate treating apparatus 300 may include a housing 320, a spin head 340, an elevating unit 360, and a liquid supply unit. The housing 320 may have a barrel shape of which a top end is opened. The housing 320 may include an inner collecting vessel 322 and an outer collecting vessel 326. The collecting vessels 322 and 326 may respectively collect different treatment solutions used in the process. The inner collecting vessel 322 may have a ring shape surrounding the spin head 340, and the outer collecting vessel 326 may have a ring shape surrounding the inner collecting vessel 322. An inside space 322a of the inner collecting vessel 322 and a space 326a between the inner and outer collecting vessels 322 and 326 may respectively function as inlets of the inner and outer collecting vessels 322 and 326 into which the treatment solutions flow. In some embodiments, the inlets may be disposed at different heights from each other. Collecting lines 322b and 326b may be connected to bottom surfaces of the collecting vessels 322 and 326, respectively. The treatment solutions flowing in the collecting vessels 322 and 326 may be provided to an external treatment solution regenerating system (not shown) through the collecting lines 322b and 326b so as to be reused.

The spin head 340 may support and rotate the substrate W during the process. The spin head 340 may correspond to a substrate support unit. The spin head 340 may include a body 342, a support pin 344, a chuck pin 346, and a support shaft 348. The body 342 may have a substantially circular top surface when viewed from a plan view. The support shaft 348 that is rotatable by a driving part 349 may be fixedly connected to a bottom surface of the body 342.

The support pin 344 may be provided in plurality. The support pins 344 may be arranged on an edge portion of the top surface of the body 342 and may protrude upward from the top surface of the body 342. The support pins 344 may be spaced apart from each other by predetermined distances. The support pins 344 may be arranged in a ring-shaped form. The support pins 344 may support an edge portion of a bottom surface of the substrate W such that the substrate W may be spaced apart from the top surface of the body 342 by a predetermined distance.

The chuck pin 346 may be provided in plurality. The chuck pin 346 may be disposed such that it is further from the center of the body 342 than the support pin 344 is. The chuck pin 346 may protrude upward from the top surface of the body 342. When the spin head 340 is rotated, the chuck pin 346 may support a sidewall of the substrate W to prevent the substrate W from deviating from a given position to a lateral direction. The chuck pin 346 may be linearly moveable between a waiting position and a support position along a radius direction of the body 342. A distance between the waiting position and the center of the body 342 may be greater than a distance between the support position and the center of the body 342. When the substrate W is loaded on or unloaded from the spin head 340, the chuck pin 346 may be placed at the waiting position. When the treating process is performed on the substrate W, the chuck pin 346 may be placed at the support position. The chuck pin 346 may become in contact with the sidewall of the substrate W at the support position.

The housing 320 may be linearly movable by the elevating unit 360 in an up-and-down direction. The housing 320 may be moved in the up-and-down direction to change a relative height of the housing 320 with respect to the spin head 340. The elevating unit 360 may include a bracket 362, a movement shaft 364, and a driving unit 366. The bracket 362 may be fixedly installed on an outer sidewall of the housing 320, and the movement shaft 364 may be fixedly installed on the bracket 362. The movement shaft 364 may be movable by the driving unit 366 in the up-and-down direction. When the substrate W is put on the spin head 340 or is lifted from the spin head 340, the housing 320 may descend such that the spin head 340 may protrude upward from the housing 320. Also, the height of the housing 320 may be adjusted in the process such that the treatment solution supplied to the substrate W is provided into a corresponding collecting vessel 322 or 326 predetermined according to the kind of the treatment solution. In other embodiments, the elevating unit 360 may move the spin head 340 in the up-and-down direction.

The liquid supply unit may include an injection member 380 and a liquid supply member 400. The injection member 380 may inject a treatment solution onto the substrate W supported by the spin head 340. The injection member 380 may include a support shaft 386, an arm 382, and a nozzle 390. The support shaft 386 may be disposed at a side of the housing 320. The support shaft 386 may have a rod shape of which a longitudinal direction is parallel to in the up-and-down direction. The support shaft 386 may be rotatable by a driving unit 388. Alternatively, the support shaft 386 may be linearly movable in a horizontal direction by the driving unit 388. The arm 382 may support the nozzle 390. The arm 382 may be combined with a top end of the support shaft 386. The support shaft 386 may be rotated, so the arm 382 may swing. The nozzle 390 may be fixedly jointed to a bottom surface of an end portion of the arm 382. The nozzle 390 can swing along with the support shaft 386. The nozzle 390 may swing to be movable between a process position and a standby position. Here, the process position may be a position facing the substrate W supported by the spin head 340, and the standby position may be a position disposed beyond the process position. For example, the treatment solution may be pure water (e.g., deionized water).

Figure 4:
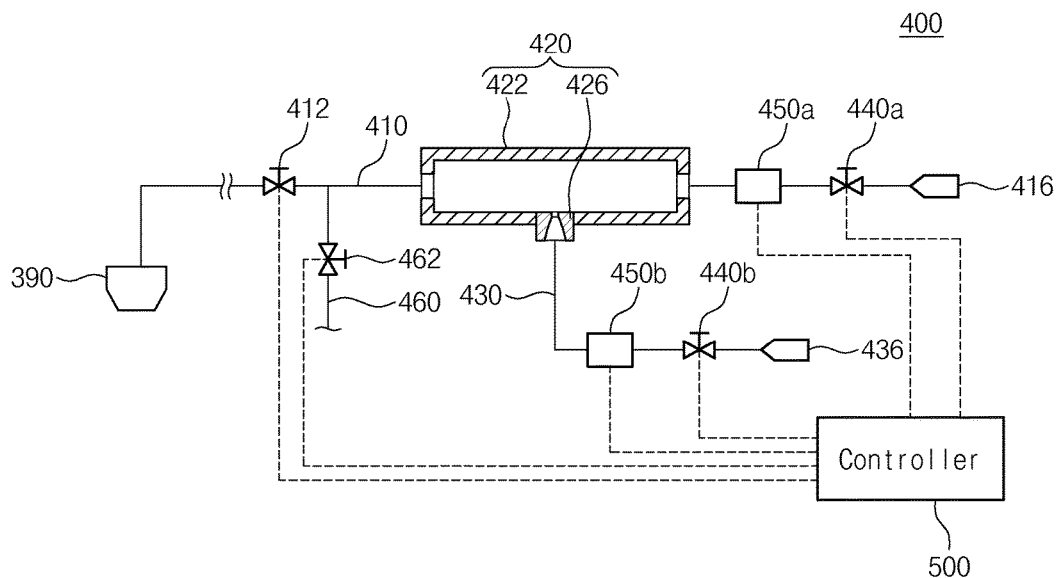
FIG. 4 is a cross-sectional view illustrating a liquid supply member of a liquid supply unit of FIG. 3.

The liquid supply member 400 may supply the treatment solution to the nozzle 390. The liquid supply member 400 may supply the treatment solution including bubbles. FIG. 4 is a cross-sectional view illustrating a liquid supply member of a liquid supply unit of FIG. 3. The liquid supply member 400 may include a liquid supply line 410, a mixing member 420, a gas supply line 430, a flow rate adjusting unit, a flow rate measuring unit, an exhaust line 460, and a controller 500. The liquid supply line 410 may supply the treatment solution stored in a liquid supply tank 416 to the nozzle 390. The liquid supply line 410 may connect the liquid supply tank 416 to the nozzle 390.

The mixing member 420 may mix treatment solution with a gas. The mixing member 420 may mix the treatment solution with the gas to form bubbles in the treatment solution. The mixing member 420 may include a body 422 and an inflow port 426. The body 422 may be installed on the liquid supply line 410. A mixing space may be provided within the body 422. The treatment solution may be supplied to the nozzle 390 through the mixing space. The inflow port 426 may be disposed in a side of the body 422. The gas supplied through the gas supply line 430 may be supplied into the mixing space through the inflow port 426. The inflow port 426 may have a hollow barrel shape. An internal diameter of the inflow port 426 may become progressively less toward the body 422.

The gas supply line 430 may supply the gas provided from a gas supply tank 436 into the mixing space. The gas supply line 430 may connect the gas supply tank 436 to the inflow port 426.

The flow rate adjusting unit may adjust a first flow rate of the treatment solution and a second flow rate of the gas. The flow rate adjusting unit may include a liquid flow rate adjuster 440a and a gas flow rate adjuster 440b. The liquid flow rate adjuster 440a may adjust the first flow rate of the treatment solution supplied through the liquid supply line 410. The liquid flow rate adjuster 440a may be installed on the liquid supply line 410. The gas flow rate adjuster 440b may adjust the second flow rate of the gas supplied through the gas supply line 430. The gas flow rate adjuster 440b may be installed on the gas supply line 430. For example, the liquid flow rate adjuster 440a and the gas flow rate adjuster 440b may be valves.

The flow rate measuring unit may measure the first flow rate and the second flow rate. The flow rate measuring unit may include a liquid measurer 450a and a gas measurer 450b. The liquid measurer 450a may measure the first flow rate of the treatment solution supplied through the liquid supply line 410. The liquid measurer 450a may be installed on the liquid supply line 410. The liquid measurer 450a may be located between the mixing member 420 and the liquid flow rate adjuster 440a on the liquid supply line 410. The liquid measurer 450a may measure the first flow rate of the treatment solution which is adjusted by the liquid flow rate adjuster 440a. The gas measurer 450b may measure the second flow of the gas supplied through the gas supply line 430. The gas measurer 450b may be installed on the gas supply line 430. The gas measurer 450b may be located between the mixing member 420 and the gas flow rate adjuster 440b on the gas supply line 430. The gas measurer 450b may measure the second flow of the gas which is adjusted by the gas flow rate adjuster 440b. In some embodiments, the flow rate may correspond to pressure of the treatment solution, and the second flow may correspond to pressure of the gas.

The exhaust line 460 may collect the treatment solution supplied through the liquid supply line 410. An exhaust valve 462 may be installed on the exhaust line 460. The exhaust valve 462 may open and close the exhaust line 460. The exhaust line 460 may diverge from the liquid supply line 410. The spot at which the exhaust line 460 diverges from the liquid supply line 410 may be disposed downstream from the mixing member 420 in a supplying direction of the treatment solution. A supply valve 412 may be installed on the liquid supply line 410 in a downstream area of the diverging spot of the exhaust line 460. The supply valve 412 may supply or interrupt the treatment solution which includes the bubbles by the mixing unit 420.

The controller 500 may control the flow rate adjusting unit, the supply valve 412, and the exhaust valve 462 such that the treatment solution has the bubbles of nano-sized diameters. The controller 500 may controls the flow rate adjusting unit, the supply valve 412, and the exhaust valve 462 in response to data received from the flow rate measuring unit. The controller 500 may control at least one of the liquid flow rate adjuster 440a and the gas flow rate adjuster 440b such that the second flow rate of the gas is greater than the first flow rate of the treatment solution. The controller 500 may compare the data received from the liquid and gas measurers 450a and 450b with predetermined range values to control the supply valve 412 and the exhaust valve 462. If the received data are in a normal state, the controller 500 may open the supply valve 412 to supply the treatment solution including the bubbles. If the received data are in a bad state, the controller 500 may open the exhaust valve 462 to collect the treatment solution including the bubbles. Here, the normal state means that diameters of the bubbles included in the treatment solution are equal to or smaller than a predetermined size, and the bad state means that the diameters of the bubbles are greater than the predetermined size. In an embodiment, the predetermined size may be 1 micrometer. The controller 500 may control at least one of the liquid flow rate adjuster 440a and the gas flow rate adjuster 440b in such a way that a difference value between the first flow rate and the second flow rate is 100 kpa or less.

Figure 5:
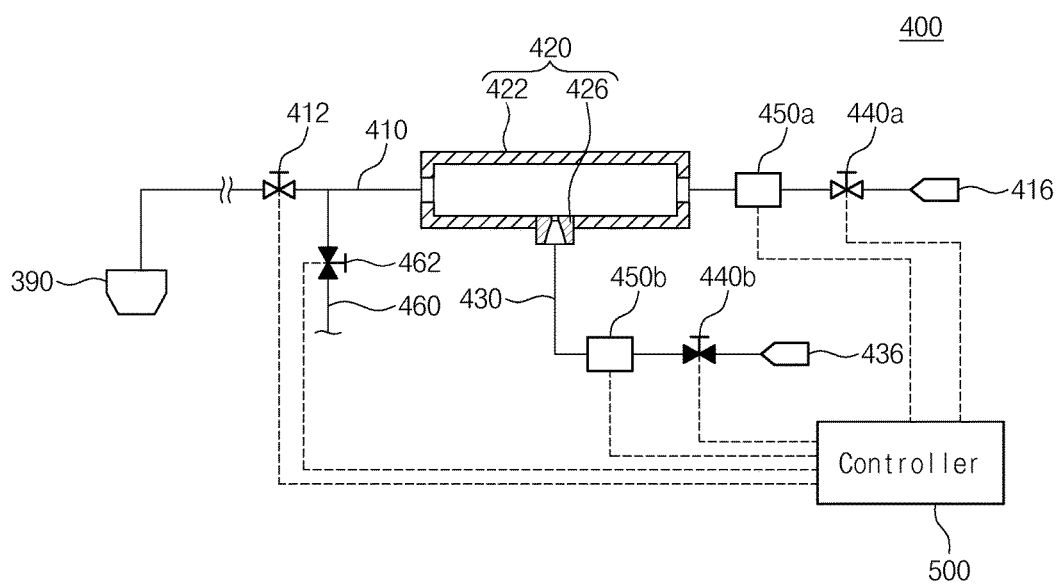
FIGS. 5 and 6 are cross-sectional views illustrating a process of supplying a treatment solution using the liquid supply member of FIG. 4.
Figure 6:
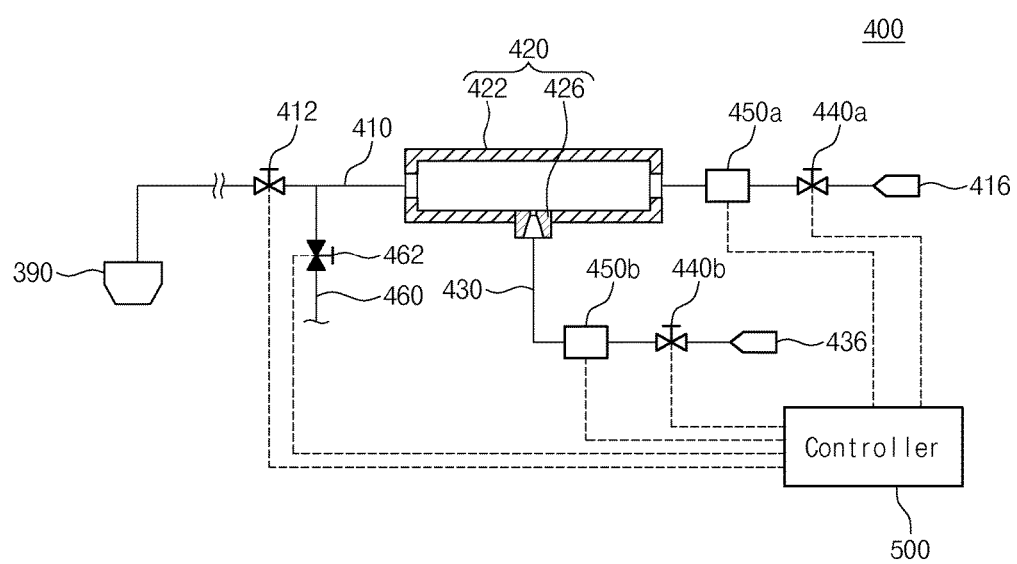
Figure 7:
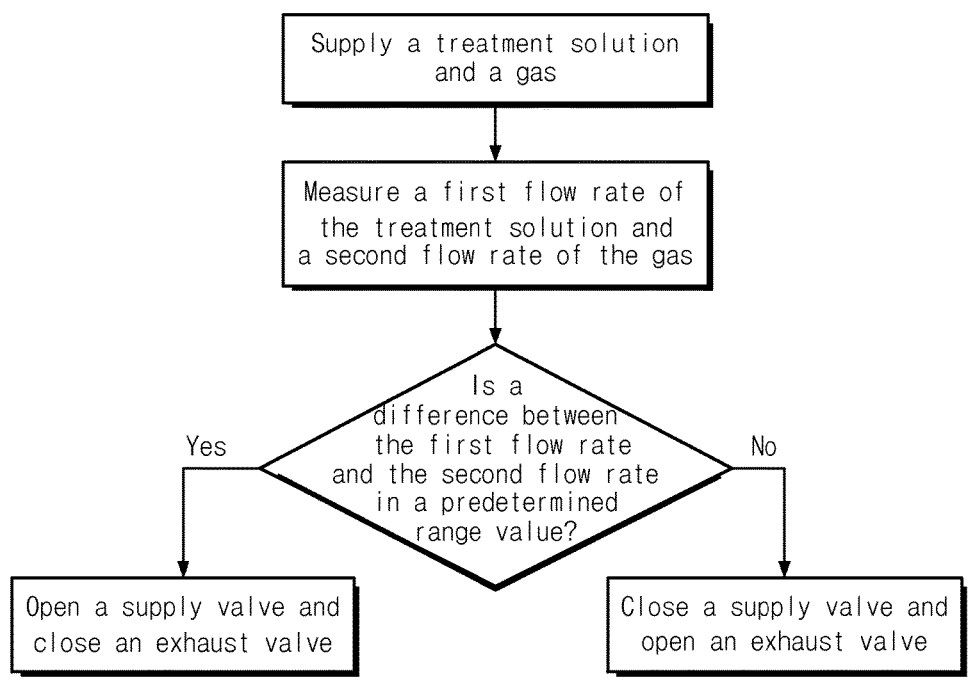
FIG. 7 is a flow chart illustrating a process of supplying a treatment solution using the liquid supply member of FIG. 4.

A process of supplying the treatment solution to the nozzle using the liquid supply member 400 described above will be described hereinafter. FIGS. 5 and 6 are cross-sectional views illustrating a process of supplying a treatment solution using the liquid supply member of FIG. 4, and FIG. 7 is a flow chart illustrating a process of supplying a treatment solution using the liquid supply member of FIG. 4. Referring to FIGS. 5 to 7, the controller 500 may control the liquid flow rate adjuster 440a to supply the treatment solution at a predetermined flow rate under a condition that the nozzle 390 is located at the standby position. Thereafter, the controller 500 may control the gas flow rate adjuster 440b to supply the gas at a predetermined flow rate. If the data received from the flow rate measuring unit are in the predetermined range value, the controller 500 may control the exhaust valve 462 to close the exhaust line 460 and may control the supply valve 412 to open the liquid supply line 410. Next, the nozzle 390 moves to the process position and then may supply the treatment solution including nano-sized bubbles having diameters of 1 micrometer or less to the top surface of the substrate W.

According to embodiments of the inventive concepts, the nano-sized bubbles may be formed in the treatment solution and may have sizes that correspond to or are smaller than a size of a space between patterns formed on the substrate. Thus, the bubbles may remove a particle provided into the nano-sized space between the patterns.

In addition, according to embodiments of the inventive concepts, the sizes of the nano-sized bubbles may be smaller than micro-sizes of bubbles formed by ultrasonic waves, thereby reducing the influence of buoyancy on the bubbles of the inventive concepts. As a result, a staying time of the nano-sized bubbles in the treatment solution may be longer than that of the micro-sized bubbles in a treatment solution, and the nano-sized bubbles may remove the particles adhered to the substrate during the staying time.

Moreover, according to embodiments of the inventive concepts, the sizes of the nano-sized bubbles are smaller than that of the bubbles formed by the ultrasonic waves, so the nano-sized bubbles may have stronger van der Waals force than the bubbles formed by the ultrasonic waves. As a result, cleaning force of the cleaning process may be improved.

Furthermore, according to embodiments of the inventive concepts, the nano-sized bubbles may have charges of the same property. Thus, repulsive force may act between the nano-sized bubbles to prevent sizes of the nano-sized bubbles from increasing by combination of the nano-sized bubbles.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for treating a substrate, the method comprising:
    supplying a treatment solution into a mixing member at a first flow rate;
    supplying a gas into the mixing member at a second flow rate such that the gas is mixed with the treatment solution to form the treatment solution including bubbles;
    measuring, by a controller, the first flow rate and the second flow rate;
    controlling, by the controller, at least one of the first flow rate or the second flow rate such that the treatment solution includes a plurality of bubbles having nanometer-sized diameters in response to a result of the measuring; and
    supplying the treatment solution including the bubbles to the substrate to treat the substrate based on the result of the measuring.

2. The method of claim 1, wherein the controlling comprises:
    adjusting the second flow rate to be greater than the first flow rate.

3. The method of claim 2, wherein the supplying supplies the treatment solution including the bubbles to the substrate in response to the result of the measuring indicating that the diameters of the bubbles are equal to or smaller than a size.

4. The method of claim 3, wherein the size is about 1 micrometer.

5. The method of claim 2, wherein
the first flow rate corresponds to a first pressure,
the second flow rate corresponds to a second pressure, and
the adjusting comprises adjusting at least one of the first flow rate and the second flow rate such that a difference between the first pressure and the second pressure is 100 kpa or less.

6. The method of claim 1, wherein the supplying supplies the treatment solution including the bubbles to the substrate in response to the result of the measuring indicating that diameters of the bubbles are equal to or smaller than a size.

7. The method of claim 6, wherein the size is about 1 micrometer.

8. The method of claim 1, further comprising:
exhausting the treatment solution including the bubbles in response to the results of the measuring indicating that the diameters of the bubbles are greater than a size so that the treatment solution including the bubbles is not provided to the substrate.

9. The method of claim 8, wherein the size is about 1 micrometer.

10. The method of claim 1, wherein the supplying includes,
opening a supply valve and closing an exhaust valve in response to the results of the measuring indicating that the diameters of the bubbles are equal to or smaller than a threshold size to provide the treatment solution including the bubbles to the substrate, and,
opening the exhaust valve and closing the supply valve in response to the results of the measuring indicating that the diameters of the bubbles are greater than the threshold size to not provide the treatment solution including the bubbles to the substrate.

11. The method of claim 1, wherein the measuring, by the controller determines whether the bubbles have nano-sized diameters based on a difference between the first flow rate and the second flow rate.

12. The method of claim 1, wherein the supplying includes controlling, by the controller, opening and closing of a supply valve and an exhaust valve based on whether a difference between the first flow rate and the second flow rate is within a value range, the supply valve being a valve configured to supply the treatment solution including the bubble to the substrate, the exhaust valve being a valve configure to collect the treatment solution including the bubble to not supply the treatment solution including the bubbles to the substrate.

* * * * *